(12) United States Patent
Sakaue et al.

(10) Patent No.: US 6,643,115 B2
(45) Date of Patent: Nov. 4, 2003

(54) ELECTROSTATIC CHUCK

(75) Inventors: Katsushi Sakaue, Kokubu (JP); Shoji Kosaka, Kokubu (JP); Ichio Kiyofuji, Kokubu (JP); Junji Ohe, Kokubu (JP); Masaki Terazono, Kokubu (JP); Yasushi Migita, Kokubu (JP); Naohito Higashi, Kokubu (JP); Hitoshi Atari, Kokubu (JP)

(73) Assignee: Kyocera Corporation, Kyoto (JP)

( * ) Notice: Subject to any disclaimer, the term of this patent is extended or adjusted under 35 U.S.C. 154(b) by 35 days.

(21) Appl. No.: 10/090,438

(22) Filed: Feb. 27, 2002

(65) Prior Publication Data
US 2002/0176219 A1 Nov. 28, 2002

(30) Foreign Application Priority Data

Feb. 27, 2001 (JP) .......................... 2001-053173

(51) Int. Cl.⁷ .............................. H02N 13/00
(52) U.S. Cl. ...................... 361/234; 279/128
(58) Field of Search ................. 361/234, 233; 279/128

(56) References Cited

U.S. PATENT DOCUMENTS

| | | | |
|---|---|---|---|
| 5,530,616 A * | 6/1996 | Kitabayashi et al. | 361/234 |
| 5,548,470 A * | 8/1996 | Husain et al. | 361/234 |
| 6,028,762 A * | 2/2000 | Kamitani | 361/234 |
| 6,447,853 B1 * | 9/2002 | Suzuki et al. | 427/585 |
| 6,447,937 B1 * | 9/2002 | Murakawa et al. | 428/696 |
| 6,507,006 B1 * | 1/2003 | Hiramatsu et al. | 219/444.1 |

* cited by examiner

Primary Examiner—Gregory J. Toatley, Jr.
Assistant Examiner—Zeev Kitov
(74) Attorney, Agent, or Firm—Hogan & Hartson

(57) ABSTRACT

Disclosed is an electrostatic chuck comprising a ceramic dielectric layer having a surface for placing thereon a work that is to be held, and an electrode provided on a surface opposite to the surface of the ceramic dielectric layer for placing the work thereon, wherein:

the placing surface of the ceramic dielectric layer is sectionalized into an outer peripheral region and a central region by gas injection grooves extending in a circumferential manner;

the surface roughness $Ra(o)$ of the outer peripheral region of the placing surface and the surface roughness $Ra(i)$ of the central region satisfy the following conditions:

$0.6 \leq Ra(i) \leq 1.5 \, \mu m$ $Ra(o) \leq 0.7 \, \mu m$ $Ra(i) \geq Ra(o)$ and the outer peripheral region of the placing surface is higher than the inner peripheral region by not less than 0.6 $\mu m$. The electrostatic chuck holds the substrate with a large adsorptive force, maintains evenness in the heat distribution of the substrate, enables the substrate to be quickly separated away from the chuck, and permits the gas to leak little.

5 Claims, 4 Drawing Sheets

ELECTROSTATIC CHUCK

BACKGROUND OF THE INVENTION

1. Field of the Invention

The present invention relates to an electrostatic chuck. More specifically, the invention relates to an electrostatic chuck which is preferably used for conveying or holding the wafers in executing a variety of treatments in the steps of producing semiconductor devices, such as etching, CVD, sputtering and the like.

2. Description of the Related Art

In the steps of producing semiconductor devices inclusive of liquid crystal, it is necessary to hold the substrate such as a wafer to treat the substrate by etching or by exposure to light, or to convey the substrate. In particular, the electrostatic chuck for electrostatically holding the substrate can be used in vacuum or in a corrosive gaseous atmosphere, is suited for the production of semiconductor devices and is, hence, widely used.

In the plasma treatment apparatus which executes the treatment in vacuum, however, space between the wafer and the surface of the electrostatic chuck on where the wafer is placed becomes vacuum, and the heat is poorly transmitted between the wafer and the electrostatic chuck. Due to the irradiation with ions during the treatment with plasma, therefore, the water is locally heated and the temperature in the wafer becomes uneven resulting in the occurrence of defects.

Japanese Unexamined Patent Publication (Kokai) No. 2-119131 discloses that many grooves are formed in the wafer-placing surface of the electrostatic chuck in a radiating manner from the center toward the outer periphery thereof, a gas which is a medium for conducting the heat is introduced into the grooves to prevent the rise of temperature of the wafer and to decrease a dispersion in the temperature in the surface of the wafer.

Further, Japanese Unexamined Patent Publication (Kokai) No. 6-112302 discloses that the wafer-placing surface of the electrostatic chuck has a roughness which is not larger than 0.3 μm to increase the contact area between the wafer and the electrostatic chuck, and to improve the conduction of heat in an attempt to evenly heat the substrate.

Japanese Unexamined Patent Publication (Kokai) No. 8-55905 discloses an electrostatic chuck in which the wafer-placing surface is divided by the a gas injection groove into a central region of the placing surface and an outer peripheral region of the placing surface, the outer peripheral region of the placing surface having a surface roughness of from 0.2 to 0.5 μm, which is finer than that of the central region of the placing surface, in order to make the temperature distribution uniform on the surface of the water.

In the electrostatic chuck having a number of grooves radially formed from the central portion disclosed in Japanese Unexamined Patent Publication (Kokai) No. 2-119131, however, the heat is evenly distributed on the central portion where the grooves are densely arranged but the temperature fluctuates depending upon the locations since the gap among the grooves increases toward the peripheral portion, involving a problem of insufficient evenness in the distribution of heat.

In the electrostatic chuck taught in Japanese Unexamined Patent Publication (Kokai) No. 6-112302, the wafer-placing surface has a fine surface roughness enabling the substrate to be evenly heated. Due to its too large adsorptive force, however, there remains residual adsorption when the application of voltage is discontinued. Therefore, the response for separting the work becomes poor causing the throughput and the productivity to be decreased.

The electrostatic chuck disclosed in Japanese Unexamined Patent Publication (Kokai.) No. 8-55905 has a problem of an increased percent defective in addition to the above-mentioned problem of separation response. That is, the electrostatic chuck offers an improved evenness of temperature distribution due to a fine roughness in the surface of the electrostatic chuck. However, an increase in the temperature causes the wafer to be warped permitting the gas to leak from the gas injection grooves which are provided with gas holes near the circumferential edge of the substrate, adversely affecting the homogeneity in the treatment with plasma and the reproduceability, driving up the percent defective.

As described above, the conventional electrostatic chucks are not capable of satisfying all of the properties such as evenness in the heat distribution, adsorptive force and separation response causing, therefore, a decrease in the throughput in the steps of producing semiconductor devices and driving up the percent defective.

SUMMARY OF THE INVENTION

It is therefore an object of the present invention to provide an electrostatic chuck which features a sharp substrate separation response and a little gas leakage yet maintaining evenness in the heat distribution of the substrate and a large adsorptive force.

The present invention is based on a discovery that the substrate separation response and the prevention of gas leakage can be improved while maintaining evenness in the heat distribution of the substrate and a large adsorptive force by controlling the surface roughness and the height of the outer peripheral region and the central region in the placing surface.

According to the present invention, there is provided an electrostatic chuck comprising a ceramic dielectric layer having a placing surface for placing thereon a work that is to be held, and an electrode provided on a surface opposite to the placing surface of the ceramic dielectric layer for placing the work thereon or provided in the dielectric layer, wherein:

the placing surface of the ceramic dielectric layer is sectionalized into an outer peripheral region and a central region by gas injection grooved extending in a circumferential manner;

the surface roughness Ra(o) of the outer peripheral region and the surface roughness Ra(i) of the central region satisfy the following conditions:

$0.6 \leq Ra(i) \leq 1.5$ μm $Ra(o) \leq 0.7$ μm $Ra(i) \geq Ra(o)$ and the outer peripheral region is higher than the inner peripheral region by not less than 0.6 μm.

As described above, the surface roughness Ra(i) in the central region of the placing surface is selected to be as large as 0.6 to 1.5 μm, and the horizontal level is differed by not less than 0.6 μm in height between the outer peripheral region of the placing surface and the central region of the placing surface, permitting the gas to enter into a gap between the work being held and the central region of the placing surface and improving evenness in the distribution of heat.

Owing to the difference in the height, the end of the wafer does not separate away from the placing surface even when the work to be held such as wafer (hereinafter simply referred to as wafer) is warped due to a rise in the temperature, since the deformation is absorbed. Accordingly, the leakage of gas from the outer peripheral region of the placing surface is prevented. Besides, since the surface roughness Ra(o) is finer than 0.7 μm in the outer peripheral region of the placing surface, a large adsorptive force is obtained on the outer peripheral region of the placing surface.

Further, based on a discovery that the roughness in the placing surface greatly affects the adsorptive force and the residual adsorptive force, the inventors have rendered the outer peripheral region of the placing surface to possess a fine surface roughness and the central region of the placing surface to possess a relatively large surface roughness, in order to realize a sufficiently large adsorptive force and a quick separation response. That is, since the central region of the placing surface has a large surface roughness and the outer peripheral region of the placing surface has a fine surface roughness, the contact area is decreased between the wafer and the electrostatic chuck. Accordingly, a large adsorptive force is produced on the outer peripheral region of the placing surface but the adsorptive force is suppressed in the central region of the placing surface, and the work separation response is improved.

In particular, it is desired that the outer peripheral region of the placing surface and the central region of the placing surface have maximum surface roughnesses $R_{max}$ of not larger than 2 μm. This makes it possible to prevent local leakage of gas and to improve evenness in the heat distribution of the work that is held, adsorptive force and separation response.

It is desired that the distance from the peripheral edge of the placing surface to the outer periphery of the gas injection groove is not larger than 10 μm. This makes it possible to narrow the outer peripheral region of the placing surface, to widen the central region of the placing surface, to widen the region where the wafer is evenly heated by gas, to narrow dead space in the outer peripheral region, thereby to increase the number of the semiconductor chips obtained from a piece of substrate and to improve the productivity.

It is further desired that the sintered body forming the ceramic dielectric layer has a relative density of not lower than 98% and a maximum porous diameter of not larger than 2 μm. This makes it possible to easily control the surface roughness of the placing surface and to decrease the amount of particles generated by the friction with the work to be treated.

It is further desired that the sintered body forming the ceramic dielectric layer has a volume resistivity of from $10^7$ to $10^{12}$ Ωcm. This makes it possible to obtain a large adsorptive force based on the Jonsen-Rahbeck force with a low application voltage.

It is further desired that the ceramic dielectric layer is formed of a sintered body comprising aluminum nitride as a chief component. This makes it possible to obtain a product which is not corroded by a corrosive gas containing fluorine or chlorine or is not corroded by a plasma, and features extended life.

BRIEF DESCRIPTION OF THE DRAWINGS

FIG. 1 illustrates the structure of an electrostatic chuck according to the present invention, wherein

DETAILED DESCRIPTION OF THE INVENTION

The electrostatic chuck of the present invention will now be described with reference to FIGS. 1 to 4.

Figure 1A:
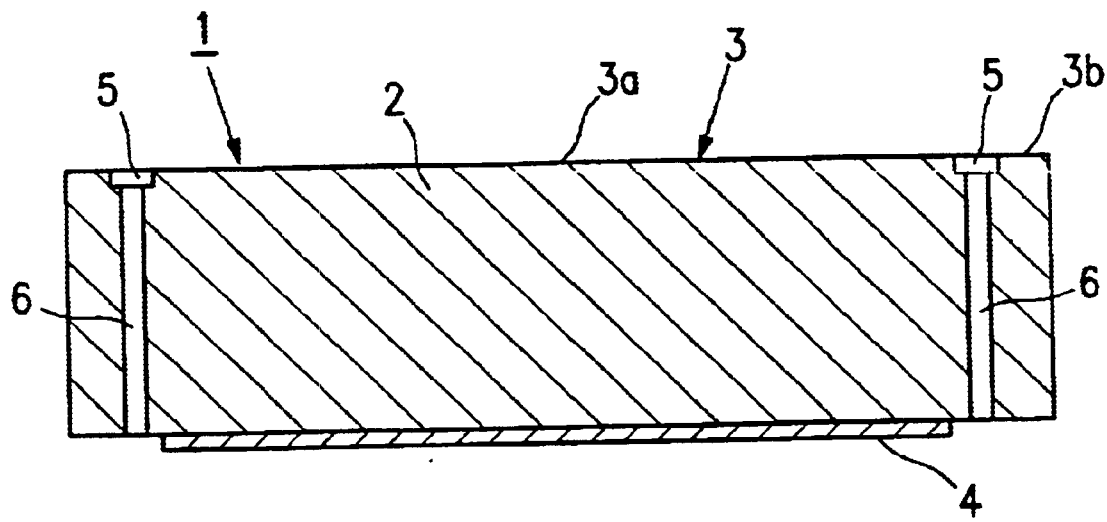
FIG. 1a is a schematic sectional view and FIG. 1b is a sectional view schematically illustrating the vicinity of the gas injection groove on an enlarged scale.

Referring to FIG. 1(a), the electrostatic chuck 1 of the present invention includes a ceramic dielectric layer 2, a placing surface 3 of the ceramic dielectric layer 2, and an electrode 4 formed on the surface opposite to the placing surface 3. Though not diagramed, the electrostatic chuck 1 includes a connection wiring for applying a voltage to the electrode 4, as a matter of course.

The placing surface 3 is for mounting the work to be held, such as silicon wafer or the like, and is divided by gas injection grooves 5 into a central region 3a and an outer peripheral region 3b, The central region 3a of the placing surface corresponds to a portion between the pair of gas injection grooves 5, and the outer peripheral region 3b of the placing surface stands for a portion on the outer side of the gas injection grooves 5.

Gas holes 6 are connected to the gas injection grooves 5, and a gas is supplied to the gas injection grooves 5 through the gas holes 6. In FIG. 1(a), the gas holes 6 are formed penetrating through the ceramic dielectric layer 2. However, the gas holes 6 may be provided with a gas supply port in the surface of the ceramic dielectric layer 2.

Figure 1B:
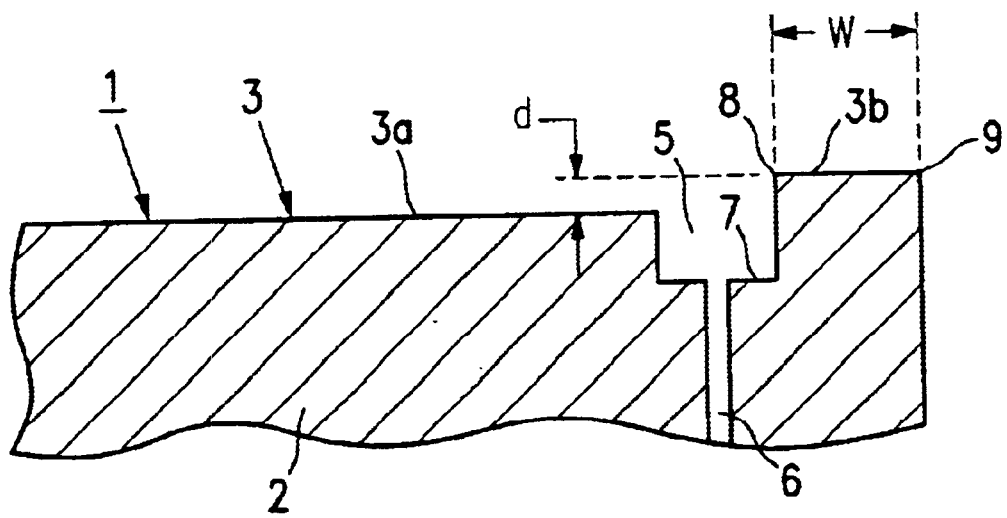

FIG. 1(b) is a sectional view illustrating, on an enlarged scale, the vicinity of the gas injection groove 5 on the right side of FIG. 1(a). In FIG. 1(b), it is important that the source roughness RA(i) of the central region 3a is from 0.6 to 1.5 μm, and the source roughness Ra(o) of the outer peripheral region 3b is not larger than 0.7 μm, and that Ra(o) is smaller than Ra(i).

Upon setting Ra(i) to be from 0.6 to 1.5 μm, the wafer positioned on the central region 3a is evenly heated due to the conduction of heat by the gas existing in the gap between the water and the central region 3a, the wafer is homogeneously treated over a wide region in the step of etching, CVD or sputtering, and a favorable separation response is obtained. It is particularly desired that Ra(i) is from 0.7 to 1.2 μm and, further, from 0.8 to 1 μm for accomplishing evenness in the heat distribution and separation response.

When Ra (i) is smaller than 0.6 μm, an increased amount of electric charge takes part in the adsorption whereby too great adsorptive force is produced for holding the wafer. When the voltage applied to the electrode for holding the wafer in discontinued, an extended period of time is required for removing the electric charge existing in large amounts and the remains residual adsorptive force. Accordingly, the separation response becomes poor and the throughput decreases. When Ra(i) exceeds 1.5 μm, on the other hand, the gas flows in an increased amount, the temperature of the wafer is dispersed and becomes uneven giving rise to the occurrence of defect in the steps of etching, CVD and sputtering.

The gas introduced from the gas injection grooves 5 is supplied into a gap between the central region 3a and the wafer, arrives at the peripheral end of the wafer passing through the gap between the outer peripheral region 3b and the wafer, and is released out of the electrostatic chuck. When Ra(o) is greater than 0.7 μm, the gas is easily released to the outer side through the gap between the outer peripheral region 3b and the wafer, i.e., the amount of leakage increases, the adsorptive force sharply decreases, and a stable adsorptive force is not obtained.

It is particularly desired that Ra(o) is not larger than 0.6 μm and, more desirably, not larger than 0.5 μm from the standpoint of obtaining a large adsorptive force and preventing the leakage. Though there is no particular limitation, it is desired that the lower-limit value of Ra(o) is 0.05 μm, particularly, 0.1 μm and, more particularly, 0.2 μm from the standpoint of cost for making the surface roughness fine.

Upon decreasing Ra(o) to be smaller than Ra(i), it is allowed to decrease the residual adsorptive force while maintaining a sufficiently large adsorptive force on the wide central region 3a of the placing surface. That is, the surface area that takes part in the adsorption decreases as the surface roughness increases and a decreased amount of electric chance takes part in the adsorptive force. Therefore, upon setting the surface roughness to lie within the above-mentioned ranges, the adsorptive force large enough for conducting the treatment is maintained though the adsorptive force on the central region 3a of the placing surface becomes smaller than that of the outer peripheral region 3b of the placing surface.

By selecting the surface roughness Ra(o) in the outer peripheral region 3b having a small area to be smaller than Ra(i) to increase the adsorptive force, further, it is allowed to suppress the amount of gas that flows out to the outer side from the outer peripheral region 3b in order to obtain a stable adsorptive force. As the amount of gas that flows out increases, the force for pulling the wafer away from the outer peripheral region 3b becomes greater than the adsorptive force, whereby the wafer separates away from the outer peripheral region 3b of the placing surface, and the adsorptive force decreases. In this case, even if Ra(o) is greater than Ra(i), the adsorptive force of the outer peripheral region 3b of the placing surface decrease, and the adsorptive force for the wafer as a whole decreases even when Ra(o) and Ra(i) are set to be the above-mentioned values.

It is therefore important that the surface roughness Ra(i) of the central region 3a of the placing surface is set to be 0.6 to 1.5 μm, the surface roughness Ra(o) of the outer peripheral region 3b of the placing surface is set to be not larger than 0.7 μm, and Ra(o) is set to be smaller than Ra(i).

Here, the surface roughness Ra represents an average rugged state on the surface. Concretely speaking, a center line average roughness is measured by a contact method stipulated under the Japanese Industrial Standards B0601. By using, for example, a handy surf device manufactured by Tokyo Seiki Co., five places are selected at random from the central portion of the groove and from the outer peripheral portion of the groove, and average values of center line roughness are measured at, at least, 20 points of each of the places.

According to the present invention, further, it is important that the outer peripheral region 3b of the placing surface is higher than the central region 3a of the placing surface by more, than 0.6 μm. The difference in the height which is lower than 0.6 μm is within a range of error in the surface roughness, and the effect of providing the difference in the height is offset. That is, despite it is attempted to improve evenness of heating by gas by controlling the surface roughness, the difference in the temperature becomes not smaller than 30° C. between the electrostatic chuck and the surface of the work that is held when the difference in the height is smaller than 0.6 μm. Therefore, the wafer warps protruding toward the outer peripheral direction due to the difference in the thermal expansion between the wafer and the ceramic dielectric, the end of the wafer is warped up, the gas leaks, and the adsorptive force sharply decreases. This becomes conspicuous when the wafer has a large size.

As shown in FIG. 1(b), therefore, it is necessary that the outer peripheral region 3b has a higher horizontal level than the central region 3a and that the difference d in the height is not smaller than 0.6 μm. With the difference d in the height being not smaller than 0.6 μm and the Ra(i) being as large as 0.6 to 1.5 μm, a gap is formed between the water and the central region 3a, and the temperature of the wafer becomes even due to the conduction of heat by gas.

Besides, since Ra(o) is as small as 0.7 μm or less, and the outer peripheral region 3b is higher than the central region 3a, a high adsorptive force is obtained in the outer peripheral region preventing the leakage of gas. As a result, the treatment is evenly conducted maintaining a very high reproduceability.

Besides, since the surface roughness is so controlled that the adsorptive force of the central region 3a is smaller than the adsorptive force of the outer peripheral region 3b, the residual adsorption lasts very little on the central region 3d after the application of voltage is discontinued. Even when the residual adsorption lasts on the outer peripheral region 3b, the area of the outer peripheral region 3b is very smaller than the area of the central region 3a and the separation response is not seriously affected and a high separation response is maintained.

It is desired that the difference d in the height is not smaller than 1 μm, preferably, not smaller than 3 μm and, more preferably, not smaller than 5 μm though it may vary depending upon the size of the wafer. If the difference d in the height is too great, it becomes equivalent to having a large dent in the central portion arousing such problems that the wafer in greatly deformed and cracked, or the wafer greatly vibrates when it is to be separated causing the position to be deviated. It is therefore desired that the upper-limit value of the difference d in the height is not larger than 10 μm though it may vary depending upon the size of the wafer.

According to the present invention, further, it is desired that maximum roughness $R_{max}$ of the central region 3a and of the outer peripheral region 3b are not larger than 2 μm, particularly, not larger than 1.5 μm and, more particularly, not larger than 1.2 μm. When $R_{max}$ exceeds 2 μm, a large damage and defect in the working may occur locally causing the gas to leak in the outer peripheral region 3b of the placing surface.

When $R_{max}$ exceeds 2 μm in the central region 3a of the placing surface, further, the gas flows through a large damage and defective portion causing the wafer to partly float and the adhering force to lose stability. Further, a temperature differential occurs in the wafer between the portion where the gas flows and the portion where no gas flows, causing the wafer to be unevenly treated and the percent defective to increase. It is therefore desired that $R_{max}$ is not larger than 2 μm.

The maximum surface roughness $R_{max}$ represents a maximum value of surface ruggedness. By using, for example, a handy surf device manufactured by Tokyo Seiki Co., five places are selected at random from the central portion of the groove and from the outer peripheral portion of the groove, and maximum heights are measured at, at least, 20 points of each of the places by the contact method stipulated under the Japanese Industrial Standards B0601.

It is further desired that the distance w from the peripheral end 8 of the placing surface 3 to the outer periphery of the gas injection groove is not larger than 10 mm, particularly, not larger than 8 mm and, more particularly, not larger than 6 mm. Further, the gas introduced into the gas injection groove 6 passes through the gap between the wafer and the outer peripheral region 3b, is released into the treating apparatus provided with the electrostatic chuck, and is removed by the accessory vacuum device. As the distance exceeds 10 μm from the peripheral end 8 of the placing surface 3, i.e., from the outermost circumference of the outer peripheral region 3b to the outer peripheral end 9 of the gas injection groove and as the gas injection groove enters into the central portion, then, the gas passes through difficultly and the adsorptive force loses stability. As the distance w increase further, the area of the outer peripheral region 3b of the placing surface increases, the adsorptive force of the water as a whole increases, the residual adsorptive force increases when the application of voltage is discontinued, and the separation response is deteriorated.

It is desired that the ceramic dielectric layer 2 has a relative density of not smaller than 98% and, particularly, not smaller than 99%, and has a maximum porous diameter of not larger than 2 μm and, particularly, not larger than 1 μm. The pores in the surface has a size of smaller than 2 μm and a small number of pores exist in the surface. Therefore, Ra(o) and Ra(i) can be easily decreased, and the maximum surface roughness $R_{max}$ can be easily controlled, to be not larger than 2 μm.

It is further desired that the ceramic dielectric layer has a volume resistivity at 50° C. of $10^7$ to $10^{12}$ Ωcm and, particularly, $10^8$ to $10^{11}$ Ωcm. When the volume resistivity is smaller than $10^7$ Ωcm, a large current leaks from the ceramic dielectric layer 2 into the work that is held to damage the work such as wafer. When the volume resistivity is larger than $10^{12}$ Ωcm, on the other hand, the Jonsen-Rahbeck adsorptive force decreases, and a sufficiently large adsorptive force is not obtained.

It is further desired that the ceramic dielectric layer 2 comprises a sintered body which contains aluminum nitride (AlN) as a chief component. The AlN is resistant against the corrosion caused by a corrosive gas containing fluorine or chlorine, or caused by a plasma, works to suppress the generation of particles and extends the life of the product. It is desired that the AlN contains metal impurities in an amount of not larger than 2% by weight, particularly, not larger than 1% by weight and, more particularly, not larger than 0.5% by weight.

As the metal constituting the electrode 4 of the electrostatic chuck 1, there can be used W, Mo, PE, Au, Ag, Ni, TiN, WC, $W_2C$, TiC, $TiB_2$, $B_4C$ and the like. When the electrode 4 is formed in the substrate having the placing surface 3 (hereinafter abbreviated as electrode is contained), it is desired to use W, WC or Mo from the standpoint of a high electric conductivity and a high firing temperature for the ceramics. Any one of the above metals may be used when the electrode 4 is to be formed on the back surface of the ceramic dielectric layer 2.

It is desired that the electrode 4 has a relative density of not smaller than 90% and, particularly, not smaller than 95% and, more particularly, not smaller than 97%. This suppresses the generation of large pores in the electrode 4 and, as a result, the adhesive force is evenly distributed on the plane.

Figure 2:
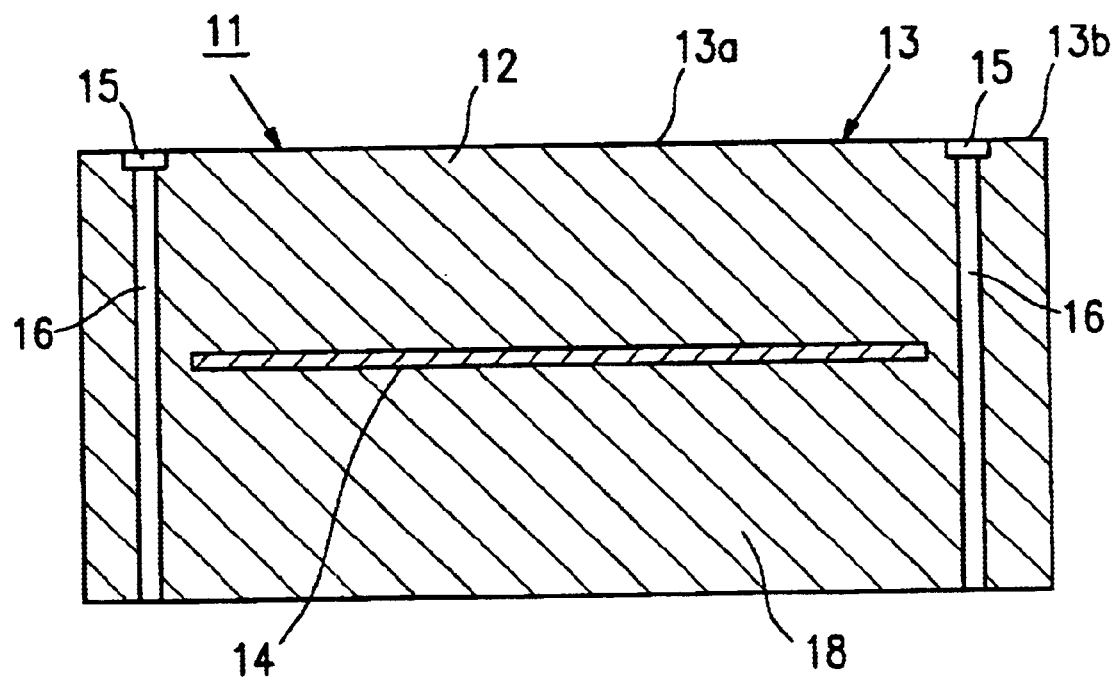
FIG. 2 is a sectional view illustrating another structure of the electrostatic chuck of the present invention.

FIG. 2 illustrates another electrostatic chuck according to the present invention. The electrostatic chuck 11 of the present invention includes a ceramic dielectric layer 12, a placing surface 13 of the ceramic dielectric layer 12, and an electrode 14 formed on the surface opposite to the placing surface 13. Though not diagramed, the electrostatic chuck 11 includes a connection wiring for applying a voltage to the electrode 14, as a matter of course.

The placing surface 13 is for mounting the work to be held such as silicon wafer or the like (hereinafter simply referred to as wafer), and is divided by gas injection grooves 15 into a central region 13a and an outer peripheral region 13b. Gas holes 16 are connected to the gas injection grooves 15, and a gap it supplied to the gas injection grooves 15 through the gas holes 16.

The electrode 14 is held by the ceramic dielectric 12 and by the substrate the ceramic dielectric 12 and the substrate 18 being formed as a unitary structure. Though there is no problem if they are strongly adhered together, it is desired that the ceramic dielectric 12 and the substrate 18 are formed of the same material to decrease the residual stress. Therefore, the electrode 14 is formed in a state of being buried in the. Ceramic. The electrode 14 formed inside as described above can be prevented from being corroded by the plasma that generates near the work that is held, and is less likely to be broken or short-circuited, making it possible to realize a highly reliable electrostatic chuck.

Figure 3:
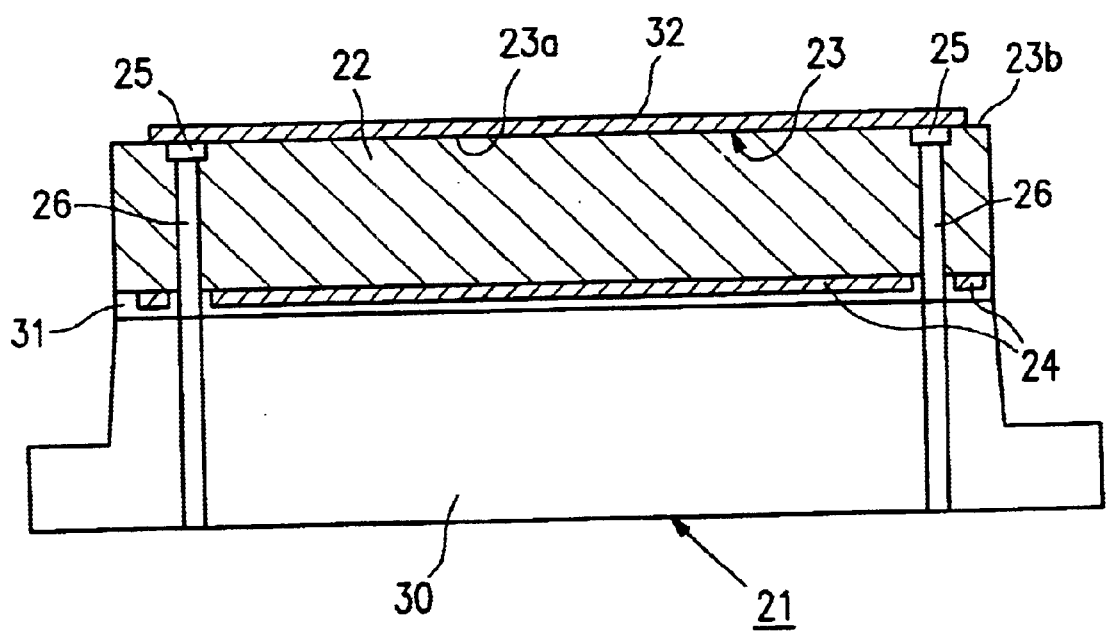
FIG. 3 is a sectional view illustrating a further structure of the electrostatic chuck of the present invention.

FIG. 3 illustrates another electrostatic chuck of the present invention, and is a sectional view schematically illustrating the structure of a electrostatic chuck 21 using a single electrode on a frame 30. That is, the ceramic dielectric layer 22 has, on one side thereof, a placing surface 23 including a central region 23a and an outer peripheral region 23b, and has an electrode 24 formed on the other surface thereof. Further, gas injection grooves 25 are formed in the placing surface 23, and gas holes 26 are connected to the gas injection grooves 25 to introduce a gas therein from an external source. The above-mentioned structure is bonded to the surface of a metal frame 30 via an adhesive layer 31 to thereby form an electrostatic chuck 21.

Though not diagramed, it needs not be pointed out the electrostatic chuck is provided with a connection wiring for applying a voltage to the electrode 24 from all external unit. When a voltage is applied across the work 32 to be held such as a wafer on the placing surface 23 and the electrode 24, the work 32 to be held is electrostatically adsorbed by the placing surface 23.

In the junction using a brazing material or a metal, the stress concentrates in the adhesive layer to develop cracks or warping. It is therefore desired that the adhesive layer is an organic adhesive layer. The warping of the electrostatic chuck 21 can be relaxed, the leakage of gas through the outer periphery can be suppressed and the adhesive force can be increased. In particular, it is desired that the organic adhesive layer 31 is formed of an organic adhesive such as soft silicon, epoxy or urethane capable of relaxing the warping of the work 32 that is held caused by a temperature differential.

Figure 4:
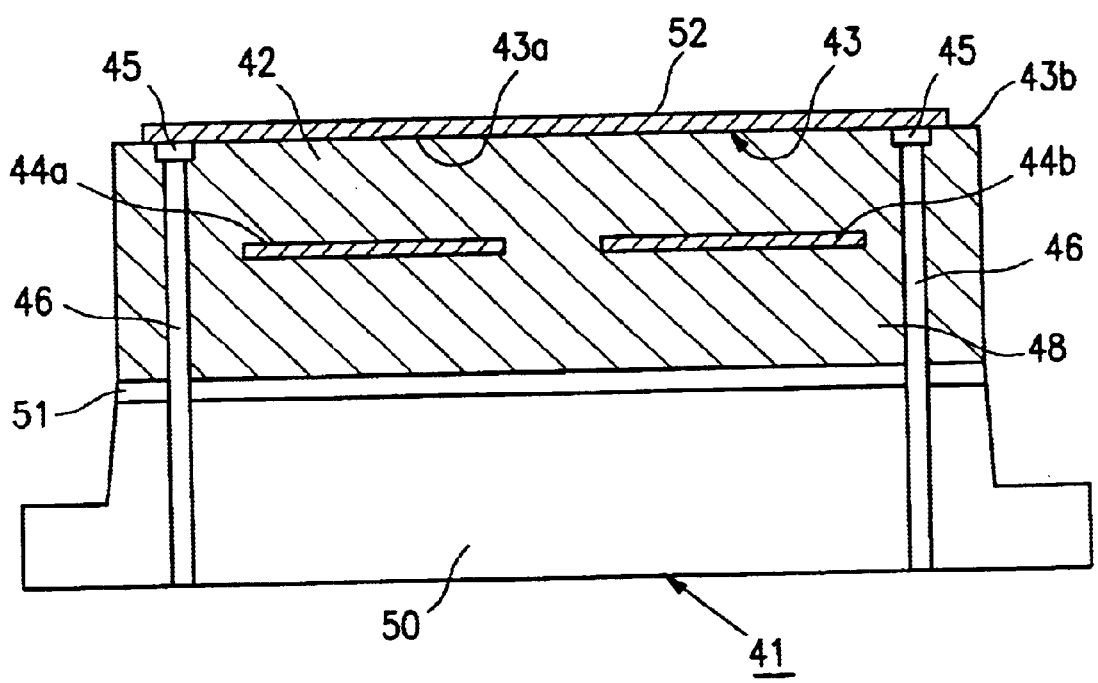
FIG. 4 is a sectional view illustrating a still further structure of the electrostatic chuck of the present invention.

FIG. 4 illustrates a further electrostatic chuck of the present invention, and is a sectional view schematically illustrating the structure of an electrostatic chuck 41 using a plurality of electrodes on a frame 50. That is, the ceramic dielectric layer 42 has, on one side thereof, a placing surface 43 including a central region 43a and the outer peripheral region 43b, and has a pair of electrodes 44a, 44b formed on the other surface thereof. Further, gas injection grooves 45 are formed in the placing surface 43, and gas holes 46 are connected to the gas injection grooves 45 to introduce a gas therein from an external source. Namely, the pair of electrodes 44 are in a state of being held by the ceramic dielectric layer 42 and the substrate 48, and are buried in the ceramics when the ceramic dielectric layer 42 and the substrate 48 are made of the same substance (ceramics).

The above-mentioned structure is bonded to a metal frame 50 via an adhesive layer 51 to thereby form an electrostatic chuck 41. Though not diagramed, it needs not be pointed out that the electrostatic chuck is provided with a connection wiring for applying a voltage to the electrodes 44 from an external unit. When a voltage is applied across the electrodes 44a and 44b, the work to be held such as a water on the placing surface 43 is electrostatically adsorbed by the placing surface 43.

Depending upon the apparatus for treatment, the electrostatic chuck is used in a container that generates plasma. In that case, it is desired that the plasma electrode is provided inside the substrate (18, 48, etc.) or an the back surface of the substrate to generate a plasma near the work (32, 52, etc.) that is to be held. This greatly contributes to simplifying the structure of the apparatus and decreasing the size of the apparatus, as well as easily controlling the plasma.

The thus constituted electrostatic chuck maintains evenness in the heat distribution of the substrate and a large adsorptive force, exhibits excellent substrate separation response and small leakage of gas, can be favorably applied to the treatment and conveyance of the substrate much as wafer while electrostatically holding it in the step of producing semiconductor device by etching, CVD and sputtering, and enables the throughput to be increased.

Next, a method of producing the electrostatic chuck of the invention will be described with reference to the case of fabricating the electrostatic chuck of FIG. 2 by using an AlN sintered body as the ceramic dielectric layer.

First the AlN powder is prepared as a starting material. The AlN powder may be prepared by either a reduced nitration method or a direct nitration method and, preferably, has a purity of not lower than 99% and an average particle diameter of not larger than 3 $\mu$m from the standpoint of obtaining a sintered body of a high purity. The starting material may contain metal impurities in a range in which they do not affect the adsorptive force. To obtain a highly pure sintered body having excellent corrosion resistance, however, it is desired that metals other than Al are contained in an amount of not larger than 2% by weight, particularly, not larger than 1% by weight and, more particularly, not larger than 0.5% by weight.

Carbon affects the sintering property. It is therefore desired that the amount of carbon is not larger than 1% by weight, particularly, not larger than 0.5% by weight and, more particularly, not larger than 0.3% by weight. It is, further, desired that the amount of oxygen is not larger than 3% by weight, particularly, not larger than 2% by weight and, more particularly, not larger than 1% by weight. This makes it possible to obtain a highly pure sintered body having excellent corrosion resistance The aluminum nitride powder is molded into any desired shape while providing an electrode therein. The molding is conducted by a metal mold press, CIP, tape molding or casting. As required, the binder component needed for the molding is removed from the molded article which is, then, calcined.

When the electrode is to be contained therein, a pair of molded articles and/or calcined bodies having a difference in the relative density of not larger than 5% are prepared. Then, an electrode is formed by preparing a paste of a mixture of a metal such as W or Mo and/or a metal compound such an TiN, as well as a ceramic sintered body which is a chief component an organic binder and a solvent, and applying the paste onto either one of the pair of molded articles and/or calcined bodies by a printing method. The pair of molded articles and/or sintered bodies are overlapped one upon the other with the electrode sandwiched therebetween. According to another method, the electrode is printed onto a molded tape, calcined and is, then, inserted between a pair of press-sintered articles.

It is here desired that the article is press-molded by using a metal mold, and the difference in the relative density between the press-calcined article and the calcined tape is rendered to be not larger than 10% and, particularly, not larger than 5%. This make it possible to effectively suppress the occurrence of peeling or cracking.

In forming the electrodes, it is desired to confirm like contraction after the firing and to determine the thickness of the electrode at the time of molding, so that the electrode is formed maintaining a thickness of not smaller than 7 $\mu$m after the sintering. It is desired that the electrode is formed maintaining a thickness of not smaller than 10 $\mu$m, particularly not smaller than 20 $\mu$m and, more particularly, not smaller than 30 $\mu$m though it may vary depending upon the composition of the paste for forming the electrode, concentration thereof, viscosity and pressing pressure.

It is desired that the molded article or the calcined article onto which the electrode paste is applied has a flatness of not larger than 200 $\mu$m, particularly, not larger than 100 $\mu$and, more particularly, not larger than 50 $\mu$m. This makes it easy to control the dispersion in the average distance from the placing surface to the electrode.

Nest, the molded article containing the electrode therein is calcined. As required, however, the binder component may be removed therefrom prior to the firing. The firing is conducted relying upon a hot press method, normal-pressure firing method or gas pressure firing method. Depending upon the cases, the HTP or the heat treatment may be executed.

The firing here is conducted based on the hot-press method. First, the molded article is loaded in a carbon mold of a hot-press machine, a pressure which is smaller than the strength of the molded article is applied thereto, and the temperature is raised. Without applying the pressure, the contraction or deformation occurs due to the rise in the temperature. When the pressure becomes larger than the strength of the molded article, the molded article cracks due to the pressure, the portion forming the electrode breaks and deforms to a large degree.

Next is desired to maintain the temperature which is lower than the firing temperature. This step of maintaining the temperature is effective in evenly heating the structure. It is desired that the temperature is maintained at 1400 to 1800° C. which is close to the contraction start temperature. The pressure for holding is smaller than the strength of the molded article and is, particularly, from 0.1 to 3 MPa. It is further desired that the temperature is maintained for not shorter than 20 minutes and, particularly, not shorter than one hour to evenly heat the structure.

After the step of maintaining the temperature has finished, the temperature is raised again, and the pressure is set to be not smaller than the strength of the molded article in a temperature range of ±100° C. from the contraction start temperature. This pressure works to effect the one-dimensional contraction while correcting the deformation of the electrode, and maintains the electrode flat. It is desired that the pressurization start temperature is in a range of ±50° C. from the contraction start temperature. At a moment when the step of maintaining the temperature has finished, the temperature may be raised again and, at the same time, the pressure may be applied.

Here, the contraction start temperature stands for a point where an extrapolated line of a straight line of when not contracted intersects an extrapolated line of a tangent of a curve of when contracted on a size contraction curve at a constant rate of temperature rise.

By effecting the firing at a temperature of 2000 to 2250° C., it is allowed to obtain a ceramic sintered product containing the electrode. It is desired that the sintering is effected at the above-mentioned temperature for more than 20 minutes and particularly, for more than one hour thereby to stably obtain a dense product. It is further desired to correct the deformation of the electrode at a moment when the structure has contracted by 90% of the amount of contraction by applying a pressure higher than the firing pressure. This makes it possible to further decrease the dispersion in the distance from the surface of the sintered product to the electrode.

It is further desired that the firing pressure is not smaller than 0.1 MPa from the standpoint of achieving a relative density of not smaller than 99%. There is no particular limitation on the rate of applying the pressure.

For example, an initial pressure of 0.1 to 0.2 MPa is applied, the temperature is maintained at 1750° C. for one hour, the temperature is raised again, the pressure of 0.5 MPa is applied at 1800° C., and the firing is conducted at 2150° C. for 4 hours. As desired, further, the pressure of not smaller than 1 MPa may be applied at, for example, 2200° C. after the firing and may be maintained for 30 minutes.

When the ceramic sintered body contains aluminum nitride crystal phase as a chief component, it is desired that the content of metals other than Al is not larger than 1% by weight in order to prevent local deformation, difference in the amount of contraction depending upon the locations, and deformation due to stress caused by inhomogeneous dispersion of the sintering assistant.

Described below is how to form the placing surface according in the invention. First the ceramic substrate having a placing surface is machined into a desired shape. For example, the gas holes and gas injection grooves are formed by grinding and drilling. Then, the central region of the placing surface and the outer peripheral region of the placing surface are finished by rotary machining and grinding to possess an average surface roughness Ra of 0.6 to 1.5 $\mu$m and a maximum surface roughness $R_{max}$ of not larger then 2 $\mu$m. Here, it is desired that the outer peripheral region is higher than the central region by about 10 to 100 $\mu$m.

Next, the outer peripheral region of the placing surface is finished by rotary machining and lapping to possess an average surface roughness Ra of not larger than 0.7 $\mu$m and a maximum surface roughness $R_{max}$ of not larger than 2 $\mu$m and the outer peripheral region is adjusted to be higher than the central region by more than 0.6 $\mu$m.

Finally, the above machined article is adhered on the side opposite to the placing surface onto a frame via an organic layer. The adhesive layer is formed of a soft resin such as imide resin, epoxy resin, silicone resin or phenol resin. They may be suitably blended with a metal or ceramic in the form of a powder or bulk to increase the strength of adhesion. After having been adhered, the placing surface may be machined.

The treating apparatus equipped with the above-mentioned electrostatic chuck is preferably used as an apparatus for producing semiconductors inclusive of liquid crystals. In the above-mentioned, step of production, the work to be held such as wafer is secured to the placing surface of the electrostatic chuck of the invention, and is efficiently conveyed and is subjected to the treatments of etching and film formation, making it possible to obtain semiconductor devices maintaining high productivity at low cost and highly reliably.

EXAMPLES

As a starting material, there was used an aluminum nitride powder prepared by a reduced nitration method having an average particle diameter of 1 $\mu$m. As desired, further, a carbon powder having an average particle diameter of 1 $\mu$m and an $Al_2O_3$ powder having an average particle diameter of 1 $\mu$m were added and mixed in a manner that the amount of the metals other than aluminum was not larger than 1% by weight.

To the mixture powder were added ethanol and a binder to prepare a slurry for molding. The slurry was press-molded into a disk having a diameter of 300 mm and a thickness of 6 mm. Further, sample for measurement was molded into a disk of a diameter of 80 mm and a thickness of 4 mm. An electrode was formed by using a paste of WC, AlN and organic binder. A pair of disk were overlapped one upon the other with the electrode sandwiched therebetween and were press-worked. Wax was removed from the molded article to use it as a structural member. The structural member was put into an AlN pot and was fired in a firing furnace. The firing was conducted by, first, maintaining a temperature of 1750° C. which was close to the contraction start temperature for one hour and, then, maintaining a temperature of 2150° C. for 4 hours.

The obtained sintered bodies were measured for their maximum porous diameters by polishing the sintered bodies like a mirror surface, and by observing fractures at ten places of each of the samples by using a scanning electron microphotography of a magnification of 1000 times.

The relative densities of the sintered bodies were calculated by, first, finding bulk densities relying on the Archimedes' method, and comparing them with true densities obtained by the He-substitution method by pulverizing the sintered bodies in compliance with the JIS R1620.

The volume resistivities were measured at 50° C. by the three-terminal method in compliance with the JIS C2141.

Next, the disks of the above sintered bodies were machined to possess outer diameters of 300 mm. Further, the gas holes and gas injection grooves were formed by drilling, and the distances w from the peripheral ends of the placing surfaces to the outer peripheries of the gas injection grooves were set to be as shown in Table 1. The whole placing surfaces were finished by the rotary machining or the grinding to possess Ra(i) and $R_{max}$ as shown in Table 1. Here, the outer peripheral region from the groove to the outer periphery was set to be higher by about 20 $\mu$m than the central region of from the groove to the center thereof. Thereafter, the outer peripheral region of the placing surface of from the groove to the outer periphery was finished by the rotary machining or the lapping to assume values shown in Table 1. Further, the difference d in height between the central region and the outer peripheral region was adjusted to assume values as shown in Table 1.

Then, the aluminum frame and the above sintered body were joined together with an epoxy resin adhesive to prepare an electrostatic chuck having a structure shown in FIG. 4.

As for the evenness in the heal distribution of the substrate, thermocouples were inserted in the surface where the plasma was generated and in the placing plate near the gas introduction holes at not less than ten places inside and outside the substrate, and dispersion was measured while monitoring the temperature in the placing surface of when the plasma was generated and when the gas was introduced.

A square silicon piece having a side of one inch was placed on the placing surface, a voltage of 500 V (bipolar voltage of 250 V) was applied at 50° C., and the force required for separating the silicon piece away from the electrostatic chuck 30 seconds after the voltage was applied, was measured as an adsorptive force. After 180 seconds after the voltage was applied, the application of voltage was discontinued, the time required until the electric charge has decreased down to 2 KPa was measured, and the electric charge-removing time was regarded to be the separation response.

The leakage of gas was found by setting a vacuum device to be 10 Pa and by measuring the flow rate of the gas flowing into the grooves of the electrostatic chuck by using a flow meter. The results were as shown in Table 1.

The samples Nos. 2 to 6, 8 to 11, 13 to 16 and 18 to 33 of the present invention exhibited adsorptive forces of not smaller than 300 MPa, gas leakages of not larger than 15 sccm, separation responses of not longer than 25 sec and dispersion in the surface of the substrate of not larger than 25° C.

The sample No. 17 outside the scope of the invention having the outer peripheral region of the same height as the central region and having d of 0, exhibited the separation response of as good as 0.5 sec but the adsorptive force of as very small an 80 MPa. The gas leakage was as large as 120 sccm.

The sample No. 12 outside the scope of the invention in which the outer peripheral region and the central region of the placing surface possessed the same surface roughness Ra, exhibited the separation response of as good as 0.5 sec but the adsorptive force of as small as 150 MPa. The gas leakage was as large 70 sccm.

The sample No. 1 outside that scope of the invention in which the outer peripheral region possessed the surface roughness Ra larger than the surface roughness Ra of the central region, exhibited the adsorptive force of as large as 600 MPa because of its fine surface roughness and the gas leakage of as small as 0.5 sccm. The separation response, however, was as poor as 180 sec.

The sample No. 7 outside the scope of the invention in which the central region of the placing surface possessed an average surface roughness Ra of as large as 2 μm, exhibited

TABLE 1

| Sample No. | Ra(i) (μm) | Ra(o) (μm) | Rmax (μm) | d (μm) | w (mm) | Density (%) | Max. pore diameter (μm) | Volum resistivity (Ωcm) | Evenness of heating (° C.) | Absorptive force (MPa) | Separation response (sec) | Gas leakage (sccm) |
|---|---|---|---|---|---|---|---|---|---|---|---|---|
| *1 | 0.3 | 0.5 | 1.0 | 4 | 7 | 99.9 | 0.1 | $8 \times 10^8$ | 19 | 600 | 180 | 0.5 |
| 2 | 0.6 | 0.5 | 0.8 | 4 | 8 | 99 | 0.9 | $5 \times 10^9$ | 18 | 530 | 25 | 0.8 |
| 3 | 0.8 | 0.5 | 1.2 | 4 | 6 | 99.8 | 0.5 | $1 \times 10^{11}$ | 16 | 500 | 5 | 1 |
| 4 | 0.9 | 0.5 | 1.0 | 5 | 6 | 99 | 1.0 | $1 \times 10^9$ | 15 | 450 | 2 | 1.5 |
| 5 | 1 | 0.5 | 1.2 | 5 | 5 | 98 | 1.5 | $3 \times 10^{10}$ | 14 | 420 | 1 | 3.0 |
| 6 | 1.5 | 0.5 | 1.5 | 4 | 5 | 99.5 | 0.7 | $5 \times 10^9$ | 13 | 300 | 0.5 | 6.0 |
| *7 | 2 | 0.5 | 1 | 4 | 7 | 98.5 | 1.3 | $5 \times 10^9$ | 11 | 200 | not separated | 30 |
| 8 | 1 | 0.2 | 1.0 | 5 | 5 | 99.3 | 0.5 | $3 \times 10^9$ | 23 | 580 | 28 | 0.2 |
| 9 | 1 | 0.3 | 1.0 | 6 | 6 | 99 | 1.0 | $5 \times 10^{10}$ | 21 | 510 | 20 | 0.5 |
| 10 | 1 | 0.5 | 1.1 | 5 | 4 | 99 | 1.5 | $7 \times 10^8$ | 15 | 480 | 1.5 | 1.0 |
| 11 | 1 | 0.7 | 1.2 | 7 | 3 | 98.8 | 1.8 | $7 \times 10^9$ | 12 | 320 | 0.8 | 5.0 |
| *12 | 1 | 1 | 1.5 | 1 | 2 | 98.3 | 2.0 | $5 \times 10^9$ | 10 | 150 | not separated | 70 |
| 13 | 0.7 | 0.3 | 0.5 | 7 | 8 | 99.5 | 0.8 | $3 \times 10^{11}$ | 21 | 540 | 20 | 1.3 |
| 14 | 1.2 | 0.5 | 1.0 | 6 | 9 | 99 | 1.1 | $5 \times 10^{10}$ | 15 | 480 | 4 | 1 |
| 15 | 1.1 | 0.6 | 1.5 | 5 | 9 | 98.5 | 1.4 | $1 \times 10^{11}$ | 14 | 470 | 12 | 2 |
| 16 | 1.5 | 0.5 | 2.0 | 9 | 8 | 98 | 1.9 | $1 \times 10^{10}$ | 13 | 350 | 1 | 25 |
| *17 | 0.8 | 0.4 | 0.8 | 0 | 8 | 99.8 | 0.4 | $2 \times 10^{10}$ | 35 | 80 | not separated | 120 |
| 18 | 0.8 | 0.4 | 0.8 | 0.3 | 8 | 99.8 | 0.4 | $3 \times 10^{10}$ | 25 | 350 | 20 | 15 |
| 19 | 0.8 | 0.4 | 0.8 | 0.5 | 8 | 99.8 | 0.4 | $1 \times 10^{10}$ | 23 | 400 | 10 | 13 |
| 20 | 0.7 | 0.4 | 1.2 | 3 | 8 | 99.8 | 0.3 | $2 \times 10^8$ | 20 | 400 | 4 | 11 |
| 21 | 0.8 | 0.4 | 1.0 | 5 | 8 | 99.8 | 0.4 | $2 \times 10^9$ | 15 | 490 | 3 | 2 |
| 22 | 0.9 | 0.4 | 1.1 | 10 | 8 | 99.8 | 0.3 | $1 \times 10^{11}$ | 13 | 520 | 5 | 3 |
| 23 | 1.1 | 0.45 | 1.3 | 4 | 3 | 99.5 | 0.4 | $5 \times 10^9$ | 25 | 400 | 6 | 10 |
| 24 | 1.2 | 0.45 | 1.6 | 5 | 5 | 99.5 | 0.4 | $3 \times 10^9$ | 15 | 460 | 2 | 4 |
| 25 | 1.3 | 0.45 | 1.7 | 5 | 7 | 99.5 | 0.45 | $1 \times 10^9$ | 10 | 470 | 1.5 | 2 |
| 26 | 1.2 | 0.45 | 1.5 | 4 | 10 | 99.5 | 0.4 | $3 \times 10^9$ | 15 | 460 | 2 | 4 |
| 27 | 0.9 | 0.7 | 2.0 | 7 | 7 | 98 | 2.0 | $2 \times 10^8$ | 11 | 390 | 1.5 | 3.8 |
| 28 | 0.9 | 0.7 | 1.2 | 6 | 7 | 99 | 1.2 | $2 \times 10^8$ | 14 | 420 | 2.5 | 2.4 |
| 29 | 1 | 0.6 | 1.2 | 6 | 8 | 99 | 1.2 | $7 \times 10^8$ | 13 | 470 | 1.8 | 1.8 |
| 30 | 1 | 0.6 | 2.0 | 7 | 8 | 98 | 2.0 | $7 \times 10^8$ | 16 | 430 | 1 | 3.0 |
| 31 | 1.2 | 0.5 | 2.5 | 4 | 8 | 99.9 | 0.4 | $1 \times 10^7$ | 14 | 350 | 2.3 | 5.5 |
| 32 | 1.2 | 0.5 | 1.8 | 4 | 8 | 99.9 | 0.5 | $1 \times 10^9$ | 15 | 430 | 1.5 | 3.5 |
| 33 | 1.2 | 0.5 | 1.8 | 4 | 8 | 99.9 | 0.4 | $5 \times 10^{11}$ | 14 | 400 | 13 | 3 |

Samples marked with * lie outside the scope of the invention.

the separation response of as good as 0.5 sec but the adsorptive force of as small as 200 MPa.

What is claimed is:

1. An electrostatic chuck comprising a ceramic dielectric layer having a placing surface for placing thereon a work that is to be held, and an electrode provided on a surface opposite to the placing surface of the ceramic dielectric layer for placing the work thereon or provided in the dielectric layer, wherein:

the placing surface of said ceramic dielectric layer is sectionalized into an outer peripheral region and a central region by gas injection grooves extending in a circumferential manner;

the surface roughness Ra(o) of the outer peripheral region and the surface roughness Ra(i) of the central region satisfy the following conditions:

$0.6 \leq Ra(i) \leq 1.5 \ \mu m$ $Ra(o) \leq 0.7 \ \mu m$ $Ra(i) \geq Ra(o)$ and the outer peripheral region is higher than the inner peripheral region by not less than 0.6 $\mu m$.

2. An electrostatic chuck according to claim 1, wherein the outer peripheral region and the central region have maximum surface roughness $R_{max}$ of not larger than 2 $\mu m$.

3. An electrostatic chuck according to claim 1, wherein the distance from the peripheral edge of said placing surface to tho outer periphery of said gas injection groove is not larger than 10 mm.

4. An electrostatic chuck according to claim 1, wherein said ceramic dielectric layer has a relative density of not lower than 98% and a maximum porous diameter of not larger than 2 $\mu m$.

5. An electrostatic chuck according to claim 4, wherein said sintered body comprises aluminum nitride.

* * * * *